(12) United States Patent
Schmidt et al.

(10) Patent No.: US 6,798,815 B2
(45) Date of Patent: Sep. 28, 2004

(54) HIGH POWER SEMICONDUCTOR LASER DIODE AND METHOD FOR MAKING SUCH A DIODE

(75) Inventors: Berthold Schmidt, Erlenbach (CH); Susanne Pawlik, Zurich (CH); Norbert Lichtenstein, Adliswil (CH)

(73) Assignee: Bookham Technology PLC, Abingdon (GB)

( * ) Notice: Subject to any disclaimer, the term of this patent is extended or adjusted under 35 U.S.C. 154(b) by 76 days.

(21) Appl. No.: 10/131,335

(22) Filed: Apr. 24, 2002

(65) Prior Publication Data

US 2004/0008746 A1 Jan. 15, 2004

(51) Int. Cl.$^7$ .............................................. H01S 3/03
(52) U.S. Cl. ........................ 372/64; 372/46; 372/45; 372/50; 372/42
(58) Field of Search .................. 372/64, 46, 50, 372/92

(56) References Cited

U.S. PATENT DOCUMENTS

| | | | | |
|---|---|---|---|---|
| 4,349,905 A | * | 9/1982 | Ackley | 372/46 |
| 4,875,216 A | * | 10/1989 | Thornton et al. | 372/45 |
| 4,965,525 A | * | 10/1990 | Zah | 330/4.3 |
| 5,440,577 A | * | 8/1995 | Tucker | 372/50 |
| 5,802,084 A | * | 9/1998 | Bowers et al. | 372/18 |
| 6,075,801 A | * | 6/2000 | Tamanuki et al. | 372/46 |
| 6,375,364 B1 | * | 4/2002 | Wu | 385/88 |
| 6,516,120 B2 | * | 2/2003 | Roberts et al. | 385/43 |
| 2003/0031222 A1 | * | 2/2003 | Balsamo et al. | 372/46 |

FOREIGN PATENT DOCUMENTS

| | | |
|---|---|---|
| EP | 1 045 496 | 10/1999 |
| EP | 1 039 599 | 2/2000 |
| JP | 60-163486 | 8/1985 |
| JP | 60163486 A * | 8/1985 ............. H01S/3/18 |
| JP | 10/145001 | 5/1998 |

OTHER PUBLICATIONS

International Search Report regarding international application No. PCT/IB03/01677 mailed Aug. 1, 2003.

* cited by examiner

*Primary Examiner*—Don Wong
*Assistant Examiner*—Dung Nguyen
(74) *Attorney, Agent, or Firm*—Renner, Otto, Boisselle & Sklar, LLP

(57) ABSTRACT

Semiconductor laser diodes, particularly high power ridge waveguide laser diodes, are often used in opto-electronics as so-called pump laser diodes for fiber amplifiers in optical communication lines. To provide the desired high power output and stability of such a laser diode and avoid degradation during use, the present invention concerns an improved design of such a device, the improvement in particular consisting of novel design of the ridge waveguide of the laser. Essentially the novel design consists in a segmented ridge waveguide having at least two straight segments, i.e. segments with constant, but different cross sections or widths, and at least one flared segment connecting the two different straight segments. A further improvement can be achieved by combining this approach with a laser diode design termed "unpumped end sections" and described in copending U.S. patent application Ser. No. 09/852,994, entitled "High Power Semiconductor Laser Diode". Preferable for an advantageous manufacturing process is a segmented ridge waveguide design with three straight segments, at least two of them differing in cross section or width, and two flared segments connecting the differing straight segments. This latter design results in a wafer pattern of identical and identically oriented laser diode structures, thus allowing the use of standard manufacturing processes.

14 Claims, 2 Drawing Sheets back section front section straight   flared   straight   flared   straight

HIGH POWER SEMICONDUCTOR LASER DIODE AND METHOD FOR MAKING SUCH A DIODE

FIELD OF THE INVENTION

The present invention relates to semiconductor laser diodes, particularly to AlGaAs-based laser diodes of high output power. Such laser diodes are commonly used in opto-electronics, often as so-called pump lasers for fiber amplifiers in the field of optical communication, e.g. for Erbium-doped fiber amplifiers. Specifically ridge waveguide laser diodes are suited to provide the desired narrow-bandwidth optical radiation with a stable light output power in a given frequency band. Naturally, output power and stability of such laser diodes are of crucial interest. The present invention relates to an improved laser diode, the improvement in particular concerning the structure and design of the ridge waveguide; it also relates to a manufacturing process for such laser diodes.

BACKGROUND OF THE INVENTION

Semiconductor laser diodes of the type mentioned above have become important components in the technology of optical communication, particularly because such lasers can be used for amplifying optical signals immediately by optical means. This allows to design all-optical fiber communication systems, avoiding any complicated conversion of the signals to be transmitted, which improves speed as well as reliability within such systems.

In one kind of optical fiber communication systems, the laser diodes are used for pumping Erbium-doped fiber amplifiers, so-called EDFAs, which have been described in various patents and publications known to the person skilled in the art. An example of some technical significance are ridge waveguide laser diodes with a power output of 150 mW or more, whose wavelengths match the Erbium absorption lines and thus achieve a low-noise amplification. Several laser diodes have been found to serve this purpose well and are used today in significant numbers. However, the invention is in no way limited to such laser diodes, but applicable to any ridge waveguide laser diode.

Generally, laser diode pump sources used in fiber amplifier applications are working in single transverse mode for efficient coupling into single-mode fibers and are mostly multiple longitudinal mode lasers, i.e. Fabry-Perot lasers. Two main types are typically being used for Erbium amplifiers, corresponding to the absorption wavelengths of Erbium: InGaAsP at 1480 nm; strained quantum-well InGaAs/AlGaAs laser diodes at around 980 nm.

Semiconductor laser diodes of the types mentioned above have a number of problems. One particular significant one is that with increasing operating light output powers of vertically and laterally single mode semiconductor laser diodes, the maximum useable light output power is limited. It is believed that this is due to various reasons:

A limited linear power due to coherent coupling of the zero order mode with higher order modes.

A thermal rollover, i.e. a reduction of the light output power efficiency, due to ohmic heating. An excessive heating leads to a drastic increased carrier leakage over the laser diode hetero barrier. As a results of the light output power decreases with increasing temperature.

A catastrophical optical mirror damage, a so-called COD. These limitations/damages seem to occur at certain power levels and are believed to be caused by increased thermal and opto-electronic influences on the waveguide like, e.g. spatial-hole burning and ohmic heating can results in a locally increased refractive index since n depends on the free carrier densitiy $N_{e,p}$ and temperature T $n=n(N_e, N_p, T)$. In an edge emitting single mode waveguide laser diode, the optical intensity typically increases towards the front facet. Usually, the latter has a reduced reflectivity compared to the back facet, due to the mirror coating: The coating of the front facet has a reflectivity between 0.1% and 10%, while the back facet coating has between 70% and 100%.

Consequently, ways have been sought to prevent the above mentioned damages and overcome the limitations. One attempt to improve the light output power of semiconductor laser diodes is described in Lang et al U.S. Pat. No. 6,014,396. Lang et al disclose how to slightly broaden the ridge waveguide sections towards the front facet and the back facet to the same aperture. This reportedly reduces the series resistance compared to a standard narrow stripe device. In addition, the lateral gain regime is increased where the power density increases due to the asymmetric mirror coating of the front an back mirror. The effect of spatial hole burning is reportedly reduced when compared to a standard narrow stripe ridge waveguide.

However, the design proposed by Lang et al is not satisfactory from all points of view for ridge waveguide like laser diodes. Whereas Lang et al. propose to widen the waveguide to 20–50 $\mu$m, standard single mode lasers with a width of more than 6–7 $\mu$m have been found unstable concerning lateral single-mode operation within the operating regime, especially when optical feedback, i.e. with a Fiber Bragg Grating (FBG), is introduced. Also, Lang et al propose to use different facet cross sections or apertures. This requires a manufacturing process whereby the laser diodes are pair-wise placed symmetrically on a wafer. In other words, when the back section of the ridge waveguide is straight, while the front region is flared, the chip pattern for the manufacturing process is designed such that adjacent laser diodes are arranged face to face. This arrangement however leads to problems in chip handling, laser diode characteristics, and reliability and is thus rather cumbersome. Clearly, a process where all laser diodes are oriented in the same direction is by far preferable for the realisation of ridge waveguide like laser diodes.

Thus, it is a general object of this invention to devise a reliable design for a high power ridge waveguide which avoids the above-mentioned problems of high power laser diodes and which in particular provides a stable and high light output under all operating conditions and a sufficiently long life of such laser diodes.

It is a more specific object of this invention to provide a ridge waveguide laser diode design including at least one specifically tapered segment or flared region towards one of the waveguide's ends, thus providing the desired stable high power output.

It is a further primary object of this invention to provide an advantageous and economical manufacturing method for the novel ridge waveguide laser diodes, allowing reliable mass production of such laser diodes.

SUMMARY OF THE INVENTION

In principle, this invention improves the subject ridge waveguide laser diodes by shaping the ridge waveguide in a particular way. The focal point is the special arrangement of the waveguide broadening or flaring towards the front and/or the back facet. To improve the light output power, the ridge waveguide section is just slightly widened towards the front and/or the back facet, preferably to the same aperture. This reduces the series resistance compared to a standard narrow stripe diode laser if the effective contact area has been increased as compared to the latter. In addition, the lateral gain regime is increased where the power density increases. Due to the lateral induced gain region towards the front facet, the beam can be further amplified, whereas in standard ridge waveguide laser diodes the amplification is locally saturated at lower power levels. The effect of spatial hole burning is thus reduced as compared to a standard narrow stripe waveguide.

Essentially, the novel waveguide design can be expressed as "Longitudinal Index Management" (LIM). LIM provides for the following:

1. the waveguide widening is small compared to common flared laser structures, usually below 10 $\mu$m;
2. front and back end-sections are ending in a locally straight waveguide geometry enabling an essentially standard, "narrow-stripe" manufacturing process; and
3. preferably front and back end-sections have the same aperture width or cross section.

To realize a flared or tapered ridge waveguide design with the above features, in particular to realize it using an essentially standard manufacturing process, a novel lithographic pattern was also designed. This will be explained further below.

In brief, the invention concerns a semiconductor laser diode with an active region including a ridge waveguide having front and back facets. This ridge waveguide comprises at least three distinct segments along its longitudinal extension:

a center segment extending with a substantially constant first cross section, a slightly tapered segment widening towards at least one of said facets, and an end segment close to the facet with a substantially constant second cross section, i.e. essentially with the cross section or aperture of the facet.

It may thus be called a "straight-flared-straight" waveguide design.

Preferably, the ridge waveguide has two tapered segments extending along the ridge waveguide, a first one widening towards the front facet and a second one widening towards the back facet of the waveguide, and two end segments, one associated with each facet. Again, the two end segments have preferably the same cross section as the associated apertures. Thus, it may be called a "straight-flared-straight-flared-straight" waveguide design.

Usually, the two tapered or flared segments have different lengths, in particular the first tapered segment being longer than the second tapered segment and they will be preferably of identical cross section. The two end segments may have substantially the same length, but this is not necessarily so.

Also usually, the ridge waveguide will be structured symmetrically with an essentially constant thickness along its whole length, the widening and the different cross sections being effected by a variation of the width of the ridge wave-guide. Preferably, the center segment is of a first width, e.g. 3 $\mu$m wide, and the end segment of a twice said width, e.g. 6 $\mu$m wide.

In other words, the ridge waveguide has a long center segment with a substantially constant first cross section, at least one flared segment widening towards one of the facets, and at least one short end segment between said tapered segment and said facet, said short end segment having a substantially constant second cross section larger than said first cross section. Preferably, the ridge waveguide has two flared segments extending and widening from the center segment towards the facets in opposite direction, connecting the long center segment continuously with said short end segments.

A novel method for manufacturing a high power ridge waveguide laser diode with facets having identical cross sections forming mirror images enables strip-wise manufacturing with subsequent breaking of the laser diodes despite the flared or tapered structure of the ridge waveguide. This was impossible for flared designs until now.

A ridge waveguide laser diode structured according to the present invention exhibits an extreme improvement over prior art laser diodes, especially with regard to its long-term stability and reliability.

This significant improvement is believed to be mainly caused by the broader end segments, enabling the injection of current over an increased contact area, while the beam stability is given by the straight center segment.

A further essential improvement can be achieved by combining the LIM design approach with a diode laser design termed "unpumped end section" and described in copending U.S. patent application Ser. No. 09/852,994, entitled "High Power Semiconductor Laser Diode", which is incorporated herein by reference. The LIM—"unpumped end section" combination further enhances the reliability of the pump laser device. The reason is that the current density, as a possible cause for device degradation, is locally reduced at the sensitive front and back end section of the laser.

Advantageously, the improvement needs just a minor increase in manufacturing complexity so that conventional manufacturing equipment may be used and usual manufacturing processes may be applied. Also, the laser diode itself has the same dimensions as before, thus avoiding any packaging changes or problems.

DETAILED DESCRIPTION OF PREFERRED EMBODIMENTS

In the following, an embodiment of the invention, both the structure and the manufacturing process, shall be described by reference to the drawings, in which:

FIG. 1 show the basic layout of a preferred embodiment of the invention which will be explained in detail in the following.

The example shows the ridge waveguide of an AlGaAs 980 nm pump laser diode in a top view. A semiconductor body, here a not shown GaAs substrate, forms the basis for the laser diode. The laser diode consists essentially of a strained quantum well (SQW) active region sandwiched by two AlGaAs cladding layers. A top p-metallization, also not shown, usually covers the semiconductor ridge waveguide together with some embedding material.

The physical dimensions of such an AlGaAs 980 nm ridge waveguide laser diode are quite small, about 0.4 mm wide and 2–4 mm long with a thickness of about 0.15 mm.

Figure 1:
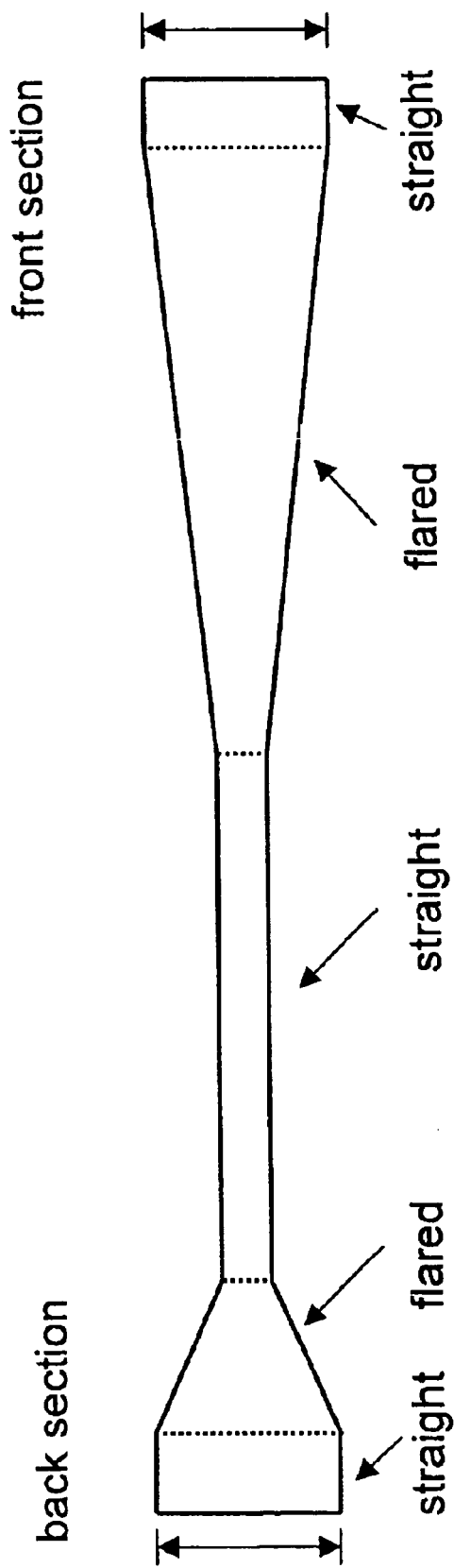
FIG. 1 shows an overview of the general structure of a ridge waveguide of a laser diode according to the invention.

The ridge waveguide layout shown in FIG. 1 is a of the "straight-flared-straight-flared-straight" type. It consists of five segments, starting from the front section on the right:

A straight part, i.e. a segment having a constant cross section or width, ending in the exit aperture of the laser diode. This straight segment is 6–8 $\mu$m wide and about 20 $\mu$m long in the present example.

A flared part, i.e. a segment having a decreasing cross section or width. Its width decreases from 6–8 μm to about 4 μm; its length is approximately 1.2 mm, here exactly 1.180 mm.

A straight center part, i.e. another segment having a constant cross section or width, smaller than the exit aperture of the laser diode. This straight segment is about 4 μm wide and about 1.2 mm, here precisely 1.116 mm long.

Another flared part, i.e. a second segment with changing cross section or width. Its width increases from about 4 μm to 6–8 μm; it is about 20 μm long. Thus it is significantly shorter than the first flared segment, i.e. has a significantly steeper opening angle.

A third straight part, i.e. a third segment having a constant cross section or width, ending in the back mirror of the laser diode. This straight segment is again 6–8 μm wide and about 20 μm long.

For a laser diode chip with other dimensions, the approximate relative sizes and dimensions of the different parts or segments are given in the following:

The first straight part, i.e. the segment having a constant cross section with the exit aperture of the laser diode, has a length of up to 5% of the total chip length.

The first flared part, i.e. the segment having a decreasing cross section or width, has a length of up to 30–60% of the chip length. Its width decreases from the wide exit cross section to a fraction of the latter.

The straight center part, i.e. the second segment having a constant cross section/width, has a length of 40–70% of the chip length.

The second flared part, i.e. the second segment with changing cross section/width, has again a length of up to 5% of the total chip length. Its width increases from the cross section of the straight center part to the wide cross section of the exit aperture.

The third straight part, i.e. the third segment with a constant cross section or width, ends in the back mirror of the laser diode. The latter has preferably the same cross section as the exit aperture. This third straight segment has again a length of up to 5% of the total chip length.

So much for the general layout of an exemplary ridge waveguide of a laser diode.

As mentioned above, the LIM waveguide design improves the efficiency and linear light output power of the pump laser diode. Depending on the geometry of the waveguide, the series resistance and therefore the junction temperature are reduced, resulting in improved reliability.

Using the LIM design according to the invention, the long straight center segment has waveguide properties comparable to a standard ridge waveguide section, while the adiabatically broadened front section, i.e. the right flared segment in FIG. 1, further amplifies the zero order mode of the laser. The flared design principle itself is well known from semiconductor optical amplifiers. However, the application of this principle for a lateral single mode pump laser diode needs more than simple adjustments. It needs even changes to become suitable for a more or less standard ridge waveguide manufacturing process. Furthermore, the straight center segment and the adiabatically broadened segment towards the laser's output facet must be well designed to emit a lateral stable single-mode characteristic within the whole operating regime even. This also applies for laser diodes equipped with fiber Bragg gratings.

In the example, the aperture width of the front facet, and thus the width of the straight segment associated with the laser's output facet, should be limited to a maximum of about 8 μm for wavelengths of around 1 μm, i.e. 1000 nm. Otherwise the coupling efficiency into a fiber tip with a standard lens is strongly reduced.

Although the invention was first carried out on 980 nm lasers in the AlGaInAs material system, it is also applicable to applications with other wavelengths, e.g. material systems ike InGaAsP/InP or AlGaInAs/InP at wavelengths ranging from 1300 μm to 1600 μm.

So much on an embodiment of a laser diode according to the invention. The following concerns a particular detail of an advantageous manufacturing process for laser diodes according to the invention.

Figure 2:
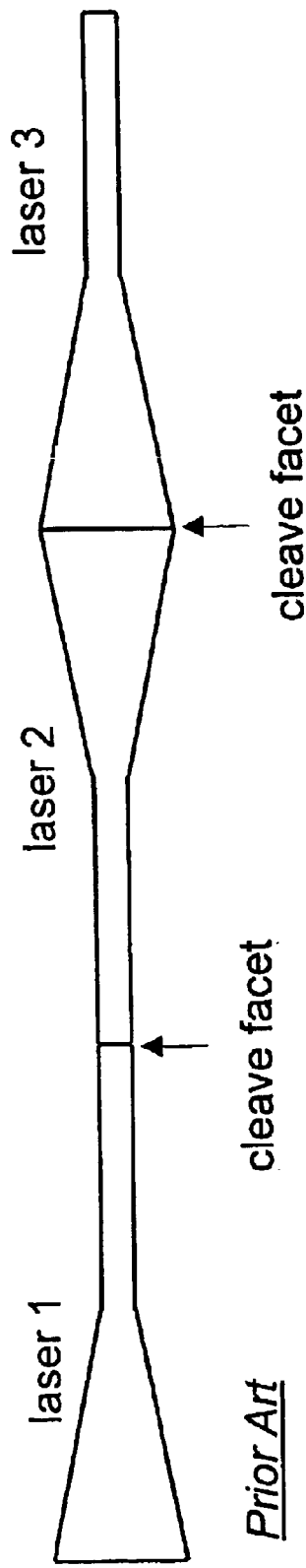
FIG. 2 shows the ridge waveguides of three laser diodes in the manufacturing process according to the prior art.
Figure 3:
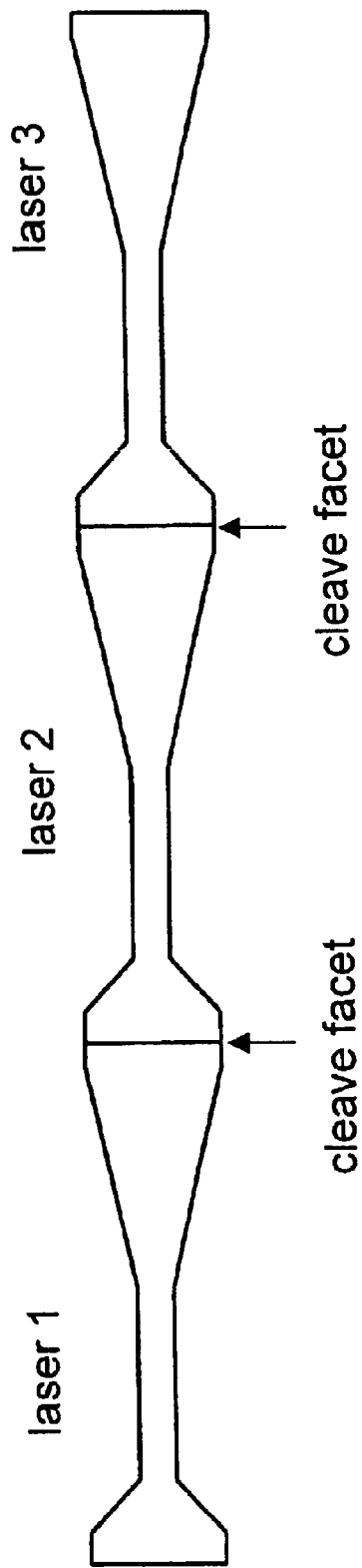
FIG. 3 depicts two "consecutive" laser diodes in the manufacturing process according to the invention.

FIGS. 2 and 3 depict a top view of three laser diodes in the manufacturing process. Usually, several hundred laser diodes of the kind described here are fabricated on a semiconductor waver. Thus the manufacturing process and its details need great care.

FIG. 2 shows a typical prior art design. Usually, flared ridge waveguide designs within a laser diode manufacturing process have been realized by designing a lithographic pattern which observed that the back segment of the waveguide was always straight, while the front region was flared. Thus the chip pattern was designed such that adjacent laser diodes were arranged face to face as shown in FIG. 2. This arrangement however was found to result not only in problems in chip handling during manufacturing, but also in varying characteristics and low reliability of the laser diodes manufactured.

FIG. 3 shows the novel design according to a specific aspect of the invention. Since all devices, i.e. laser diodes, are identical and oriented in the same direction, the new pattern results in equal devices all over the wafer as shown in FIG. 3. This design results in an improved device performance concerning maximum light output power and efficiency.

The many other steps in the manufacturing process remain essentially standard and are well known to a person skilled in the art.

Additional advantages and modifications will readily occur to a person skilled in the art and the invention is therefore not limited to the specific embodiments, details, and steps shown and described herein before. Modifications may be made without departing from the spirit and scope of the general inventive concepts as defined in the appended claims.

What is claimed is:

1. A semiconductor laser diode with an active region including a ridge waveguide having front and back facets comprising
    extending between said facets:
        said ridge waveguide having essentially constant thickness and
        a center segment with a substantially constant first cross section, having a length of 40–70% of the diode length,
        two tapered segments extending and widening from the center segment towards said facets in opposite direction, and
        two end segments between said tapered segments and said facets, each said end segment having a substantially constant cross section larger than said first cross section,
        said two tapered segments being of different lengths,
        a first one of said tapered segments having a length of 30–60% of the diode length, and
        a second one of said tapered segments having a length of up to 10% of the diode length.

2. The laser diode according to claim 1, wherein the two end segments have different cross sections.

3. The laser diode according to claim 1, wherein the two end segments have substantially the same cross section.

4. The laser diode according to claim 1, wherein the two end segments have substantially the same length.

5. The laser diode according to claim 1, wherein the two facets of the ridge waveguide are essentially identical in form and size, thus allowing common fabrication of a plurality of lasers.

6. The laser diode according to claim 1, wherein the ridge waveguide is structured symmetrically along its longitudinal axis with an essentially constant thickness along, its length, the widening and the different cross sections being effected by a variation of the width of said ridge waveguide.

7. The laser diode according to claim 6, wherein the center segment is of a first width and the widened end segment of a second width, said second width being approximately twice said first width.

8. The laser diode according to claim 6, wherein the center segment is at least 3 $\mu$m wide and the end segment at least 6 $\mu$m wide, the tapered segment connecting the center and the end segment thus being between at least 3 and 6 $\mu$m wide.

9. The laser diode according to claim 1, wherein at least one end segment has a length of up to 5% of the diode length.

10. The laser diode according to claim 9, wherein the two end segments have essentially the same cross section.

11. A method for manufacturing a high power ridge waveguide laser diode with an active region including a ridge waveguide having front and back facets and extending between said facets:

said ridge waveguide having essentially constant thickness, a center segment with a substantially constant first cross section, having a length of 40–70% of the diode length, two tapered segments extending and widening from the center segment towards said facets in opposite direction, and two end segments between said tapered segments and said facets, each said end segment having a substantially constant second cross section larger than said first cross section, said two tapered segments being of different lengths, a first one of said tapered segments having a length of 30–60% of the diode length, and a second one of said tapered segments having a length of up to 10% of the diode length characterized in that said facets having identical cross sections forming mirror images, thus enabling strip-wise manufacturing with subsequent breaking of the laser diodes.

12. The semiconductor laser diode according to claim 1, further comprising a metallization over the ridge waveguide for injecting carriers into the active region and means for limiting said injection of carriers by providing an unpumped section in the vicinity of the front and/or the back facet.

13. The laser diode according to claim 12, wherein the means for limiting the injection of carriers is an isolation layer between the laser diode's active region and the metallization.

14. The laser diode according to claim 12, wherein the isolation layer limiting the injection of carriers into the laser diode's active region extends over both end segments.

* * * * *